(12) United States Patent
Hartnett

(10) Patent No.: US 8,327,202 B2
(45) Date of Patent: Dec. 4, 2012

(54) SYSTEM AND METHOD FOR SCAN TESTING

(75) Inventor: Fred Hartnett, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1521 days.

(21) Appl. No.: 11/180,429

(22) Filed: Jul. 13, 2005

(65) Prior Publication Data
US 2007/0033460 A1 Feb. 8, 2007

(51) Int. Cl.
G01R 31/28 (2006.01)

(52) U.S. Cl. .......................... 714/726; 714/727; 714/729

(58) Field of Classification Search .................. None
See application file for complete search history.

(56) References Cited

U.S. PATENT DOCUMENTS

| 5,768,289 | A | * | 6/1998 | James | 714/727 |
| 5,867,507 | A | | 2/1999 | Beebe et al. | |
| 5,983,017 | A | * | 11/1999 | Kemp et al. | 717/129 |
| 6,006,343 | A | | 12/1999 | Whetsel | |
| 6,347,368 | B1 | * | 2/2002 | Harthcock | 712/227 |
| 6,449,709 | B1 | * | 9/2002 | Gates | 712/202 |
| 6,460,148 | B2 | * | 10/2002 | Veenstra et al. | 714/39 |
| 6,499,124 | B1 | | 12/2002 | Jacobson | |
| 6,546,507 | B1 | * | 4/2003 | Coyle et al. | 714/43 |
| 6,594,741 | B1 | * | 7/2003 | Chang | 711/156 |
| 6,678,848 | B1 | | 1/2004 | Chan | |
| 6,704,895 | B1 | * | 3/2004 | Swoboda et al. | 714/726 |
| 6,842,858 | B2 | * | 1/2005 | Suzuki | 713/2 |
| 6,851,013 | B1 | * | 2/2005 | Larsen et al. | 711/103 |
| 7,080,283 | B1 | * | 7/2006 | Songer et al. | 714/30 |
| 7,095,718 | B1 | * | 8/2006 | Terry | 370/241 |
| 7,149,927 | B2 | * | 12/2006 | Stancil | 714/31 |
| 7,165,199 | B2 | * | 1/2007 | Warren | 714/724 |
| 2002/0065646 | A1 | * | 5/2002 | Waldie et al. | 703/26 |
| 2002/0162098 | A1 | * | 10/2002 | Suzuki | 717/168 |
| 2003/0056196 | A1 | * | 3/2003 | Kim et al. | 717/124 |
| 2004/0044937 | A1 | | 3/2004 | Dubey | |
| 2004/0059973 | A1 | * | 3/2004 | Sherman et al. | 714/724 |
| 2004/0199832 | A1 | * | 10/2004 | Powers et al. | 714/48 |
| 2004/0268181 | A1 | * | 12/2004 | Wang et al. | 714/30 |
| 2006/0208157 | A1 | * | 9/2006 | Michiie | 250/208.1 |
| 2006/0277346 | A1 | * | 12/2006 | Doak et al. | 710/305 |
| 2007/0101040 | A1 | * | 5/2007 | Feldstein et al. | 710/306 |

* cited by examiner

Primary Examiner — Guerrier Merant

(57) ABSTRACT

A scan system comprises a scan engine adapted to receive a scan request from a host system for performing a scan test on a system-under-test. The scan engine comprises dedicated logic where a state of the dedicated logic is adapted to control processing of the scan request on the system-under-test.

20 Claims, 3 Drawing Sheets

SYSTEM AND METHOD FOR SCAN TESTING

BACKGROUND

Scan testing is a technique developed in the late 1980's for testing an integrated circuit device. The fundamental concept of this technique is to add shift registers to the boundary of the integrated circuit that can be used to shift in logic values known as test vectors as input values. The output values produced by the integrated circuit in response to the test vectors are then shifted out of the integrated circuit to determine whether the output matched expected values. This scan testing technique was later standardized as the IEEE (Institute of Electrical and Electronic Engineers) 1149.1 standard.

Scan testing is used by many manufacturers to test electrical connections on a device-level, board-level, as well as system-level. This test is also heavily relied on during printed circuit assembly process, configure-to-order process, field installation, and repair process. To perform scan-based testing, a scan controller is used to interface between a personal computer or workstation host system and the system-under-test. The host system generally provides a human interface to the testing process. The host system may be used to formulate the test vectors as well as analyzing the test results. The scan controller provides hardware and software support to enable the host system to communicate with the system-under-test and to drive the electrical protocol defined by the IEEE 1149.1 specification.

The scan controller is a microprocessor-based system that has a number of shortcomings. The microprocessor-based scan controller has a data transfer latency problem that stems from the interrupt or polling process that is used to transfer data between the host system and the system-under-test. A second problem is the cost associated with the microprocessor-based scan controller. Such a controller requires, in addition to the microprocessor itself, other electronic components for scratch memory, firmware storage, decode logic, etc. In addition to the cost, these extra components also occupy precious board real estate. The significant expense associated with authoring, debugging, and long-term maintenance of firmware resident in the controller also adds to the cost of the controller. Because electronic part obsolescence is common, frequent firmware modification or update, or even the replacement of the microprocessor itself may become necessary.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE DRAWINGS

The preferred embodiment of the present invention and its advantages are best understood by referring to FIGS. 1-4 of the drawings, like numerals being used for like and corresponding parts of the various drawings.

Figure 1:
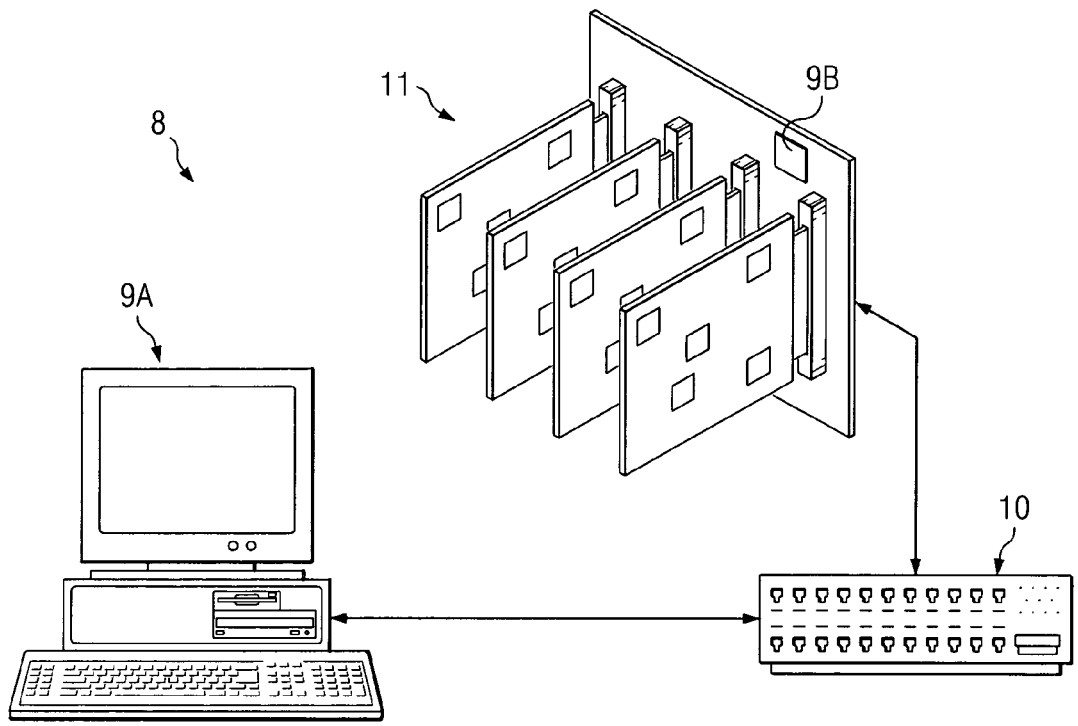
FIG. 1 is a diagram illustrating an embodiment of a scan testing system in accordance with the present invention.

FIG. 1 is a diagram illustrating an embodiment of a scan test system 8 in accordance with the present invention. In the embodiment illustrated in FIG. 1, system 8 comprises at least one host system 9A and/or 9B communicatively coupled to a scan engine 10, and scan engine 10 is communicatively coupled to a system-under-test 11. Host systems 9A and/or 9B generally comprise one or more computing devices such as microcontrollers, microprocessors, personal computers or computer workstations, for example. In the embodiment illustrated in FIG. 1, host system 9B comprises a local host system that is co-located with the system-under-test 11, and host system 9A comprises a remote host system or a host system not co-located with the system-under-test 11. The remote host system 9A and local host system 9B of system-under-test 11 may utilize the same or different protocols for interfacing with scan engine 10. For example, the remote host system 9A may conform to the IEEE 1284/1285 standard, while the local host system 9B may use a generic 8-bit interface. A round-robin arbitration method, for example, may be used to provide the local and remote host systems access to scan engine 10 control and status registers. System-under-test 11 may comprise an integrated circuit device, a circuit board comprising a plurality of integrated circuit devices and other components, a multi-circuit board system, or other types of integrated circuit devices or systems. In operation, a user operates scan engine 10 via host system 9A and/or 9B. For example, in some embodiments of the present invention, the user formulates test vectors as inputs to the system-under-test 11, and evaluates and analyzes the test results. Host systems 9A and/or 9B may also provide a graphical user interface to the user to facilitate user interaction with scan engine 10.

Figure 2:
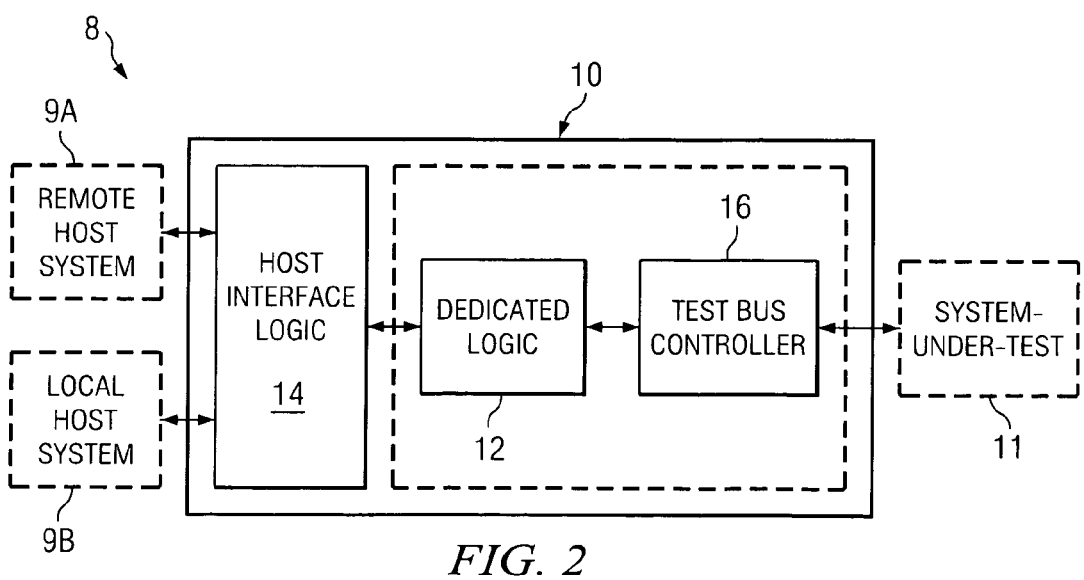
FIG. 2 is a diagram illustrating an embodiment of a scan engine of the scan testing system illustrated in FIG. 1 in accordance with the present invention.

FIG. 2 is a block diagram illustrating an embodiment of scan engine 10 in accordance with the present invention. Scan engine 10 comprises dedicated logic 12 in communication with host interface logic 14 and a test bus controller (TBC) 16. Dedicated logic 12 may be implemented by programmable devices such as a complex programmable logic device (CPLD), field programmable gate arrays (FPGAs), application-specific integrated circuits (ASICs), or other programmable logic devices (PLDs) now known or later developed. Dedicated logic 12 generally comprises a large matrix of programmable elements that can be programmed to form interconnections and perform logic functions. Host interface logic 14 is coupled to or in communication with host systems 9A and 9B, and test bus controller 16 is coupled to or in communication with system-under-test 11. Test bus controller 16 is adapted to drive the electrical protocol defined by the IEEE 1149.1 specification and interface with system-under-test 11 according to the IEEE standard. In an alternate embodiment, the functionality of test bus controller 16 may be incorporated within and implemented by dedicated logic 12 as indicated by the phantom outline in FIG. 2.

Figure 3:
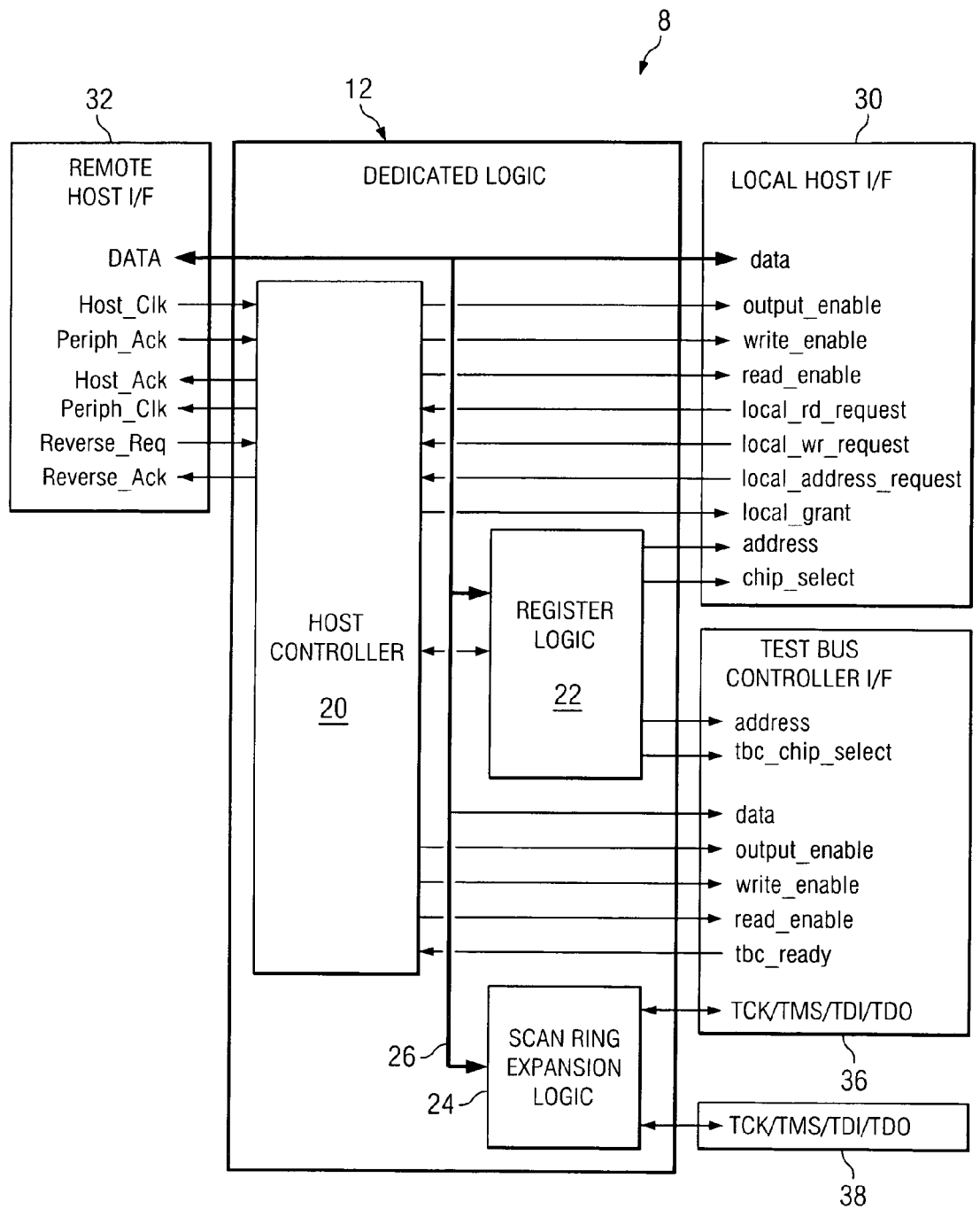
FIG. 3 is a more detailed diagram illustrating an embodiment of the scan engine illustrated in FIG. 2.

FIG. 3 is a more detailed block diagram of an embodiment of dedicated logic 12 of scan engine 10 in accordance with the present invention. In the embodiment illustrated in FIG. 3, dedicated logic 12 comprises three main functional blocks: host controller 20, control and status register logic 22, and scan ring expansion logic 24. Host controller 20 is dedicated logic that is operable to interface with remote or local host systems using IEEE 1284 or 1285 standard, for example. Host controller 20 is also operable to interface with multiple host systems using the same or different protocols or standards. For example, in some embodiments of the present invention, because remote and local host systems 9A and 9B may share a common data bus 26 in scan engine 10, host controller 20 is also operable to arbitrate access to data bus 26 by the local and remote host systems 9A and 9B. Host controller 20 uses local host interface (I/F) signals 30 and remote host I/F signals 32 to communicate with the local and remote host systems 9B and 9A, respectively, to arbitrate requests to access the shared resources of scan engine 10. For example, if host controller 20 interfaces with remote host system 9A using IEEE 1284 interface standard, arbitration handshaking signals are unavailable. Thus, in this embodiment of the present invention, host controller 20 is configured to block or otherwise prevent access by remote host system 9A when the local host system 9B is accessing scan engine 10, and vice versa. Further, host controller 20 is operable to control the speed at which data is transferred between test bus controller 16 (FIG. 2) and one or more host systems to avoid loss of data. A set of test bus controller I/F signals 36 is used to communicate with test bus controller 16 (FIG. 2) e.g., ADDRESS, TBC_CHIP_SELECT, OUTPUT_ENABLE, WRITE_ENABLE, READ-ENABLE and TBC_READY.

Further, test bus controller 34 (FIG. 2) typically provides one copy of IEEE 1149.1 signals (e.g. TCK, TMS, TDI, TDO, and, optionally, TRST). TCK is the free running clock, which is fanned out to all scannable devices in the system-under-test 11. TMS is a tap state machine control signal which is a sample on the rising edge of TCK by each scannable device. TMS and TCK are used in concert to traverse the various states of the IEEE 1149 state machine designed into each tap controller of each scannable device. With this state machine, and proper manipulation of the TMS signal, the host system can perform instruction of data ring scans with each scannable device. The TDI signal, which is also sampled on the rising edge of TCK, provides the scan in data to each scan device. This scan in data is a serial bit stream of information, clocked in at the TCK rate, which is used to load specific instruction or data ring values within each scannable device. TDO is an output from each scannable device and is updated on the falling edge of TCK. TDO provides a serial bit stream of data being scanned out of the instruction or data ring each scannable device.

Figure 4:
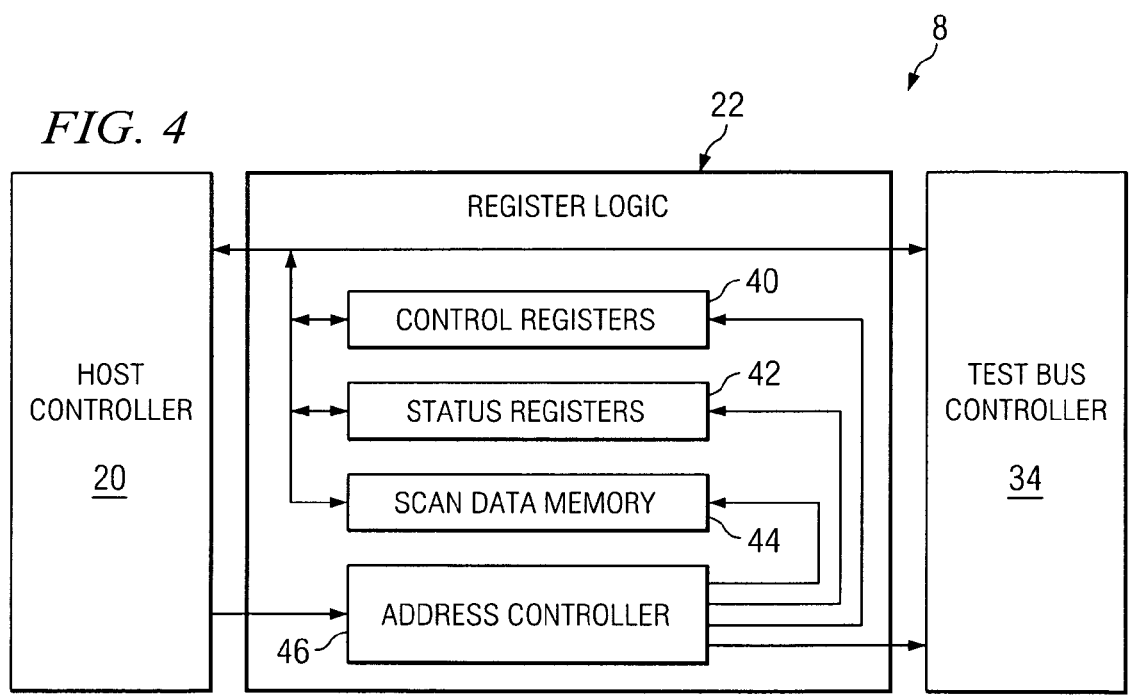
FIG. 4 is a more detailed diagram illustrating an embodiment of dedicated logic of the scan engine illustrated in FIG. 3 in accordance with the present invention.

Dedicated logic 12 further comprises register logic 22, which is illustrated in more detail in FIG. 4. Register logic 22 comprises registers and counters used for configuring and operating the scan requests or operations. For example, register logic 22 comprises control registers 40 used to control and/or otherwise address configuration and/or other parameters in scan engine 10, status registers 42 used to contain error and status bits pertaining to operations of scan engine 10, scan data memory 44 to store scan read and write data, and an address controller 46 to control which register or memory location is to be read or written. The register controller is controlled by the arbitration logic in the host controller 20 to ensure each host is granted unique access to the control registers and scan data memory. The register controller is also equipped with address auto increment/decrement functionality in order for a host to read or write large blocks of scan data memory without the need to provide an address for each access. Table A below lists exemplary bits in control register 40.

TABLE A

| Name | Description |
|---|---|
| LOCAL_USING_TBC | bit indicates when the local host has control of TBC and data bus |
| REMOTE_USING_TBC | bit indicates when the remote host has control of TBC and data bus |

TABLE A-continued

| Name | Description |
|---|---|
| RESET_TBC | bit resets TBC |
| FORCE_TMS | bit forces all test-mode-select (TMS) outputs to a logic 1 value |
| ADDR_MODE | two bits selects one of four address controller mode for the next scan operation |
| EN_ADDR_CONTROL | bit enables the address controller |

Table B below lists exemplary bits in status register 42.

TABLE B

| Name | Description |
|---|---|
| ILLEGAL_TBC_CONFIG | bit indicates the current TBC configuration settings are not supported and a scan operation should not be performed |
| SCAN_COMPLETE | bit is asserted when the previous scan command has been completed |
| INVALID_ADDR_OP | bit is asserted when a host operation is inconsistent with operating mode |
| PAUSE_STATE | flag indicates that pause state was encountered during previous scan read or write operations |
| SCAN_ABORTED | flag indicates the previous scan operation was aborted by a host system |
| TDO_DIFFERENCE | flag indicates that a scan data difference was detected between two or more rings |
| OWNERSHIP_REVOKED | bit set whenever one host takes over ownership of TBC and data bus |
| SEQUENCE_ERROR | bit is set when a read/write handshake sequencing error is detected |

In accordance with one embodiment of the present invention, in operation, an arbitration scheme is used to enable the local and remote host systems 9B and 9A to access scan engine 10 in an orderly manner. For example, a round-robin scheme may be used. For example, once local host system 9B is granted access, it completes its data transfer and then releases its control. The other host system (e.g., remote host system 9A) is simply blocked from access during this time period. Similarly, local host system 9B may be blocked from access while another host system (e.g., remote host system 9A) is granted access. However, it should be understood that other methods may be used to control access to scan engine 10 by local and remote host systems 9B and 9A.

Referring to FIG. 3, it may be seen that local host I/F 30 comprises a number of signals including LOCAL_RD_REQUEST, LOCAL_WR_REQUEST, and LOCAL_ADDRES_REQUEST, which are inputs requesting read, write, or addressing access to the shared resources of scan engine 10. The arbitration logic responds by asserting LOCAL_GRANT, when the local host 9B is given access to the shared resources. The local host 9B also uses signals such as OUTPUT_ENABLE, WRITE_ENABLE, READ_ENABLE, ADDRESS and CHIP_SELECT, for example, for interfacing with scan engine 10. Once given access, the local host system 9B reads or writes the data or address information on the data bus while the address controller 46 completes the transfer using these control signals.

Remote host system 9A, in the embodiment in FIG. 3, uses an asynchronous IEEE 1284 standard interface and uses a number of signals such as PERIPH_ACK, HOST_ACK, REVERSE_ACK, REVERSE_REQ, and clock signals HOST_CLK and PERIPH_CLK negotiate data and command transfers between scan engine 10 and the remote host system 9A. However, it should be understood that interfacing signals may be otherwise identified and characterized.

Thus, in operation, one of local or remote host systems 9B or 9A gains access to scan engine 10 via an arbitration process performed by scan engine 10 (e.g., via host controller 20). Once host controller 20 asserts a "grant" signal, scan engine 10 enters a grant state, in which the granted host system drives a new register address or scan data memory base address onto data bus 26. Host controller 20 responds by enabling the write path to the address register and the address is written into the address register, at which time the system enters a read or write complete state. The granted host is now ready to perform a data read or write operation of a status register, control register, TBC register, or scan data memory. A data writing operation is used to supply test vectors to test bus controller 16 or to configure scan engine 10. A read operation by host system 9A or 9B is used to return data from the system-under-test 11 to the host system 9A or 9B. The read data operation is also used to read the contents of status, configuration and other registers.

Scan ring expansion logic 24 is used to expand scan ring control of test bus controller 16 (FIG. 2) into as many scan rings or chains as desired or necessary for testing the system-under-test 11. Because the host system 9A or 9B is generating tests for the system-under-test 11, the host system 9A or 9B uses predefined knowledge of the architecture to select a particular scan ring to test. The host-provided scan ring number is used to control a multiplexer within the scan ring expansion logic 24 to receive scan out data from one of any number of system- or board-level scan rings and drive a single chain of scan out data into the test bus controller 16 (e.g., via TDO[n:0] of signals 38 where [n:0] indicates some "n+1" number of signals in a bus). In order to select the desired scan ring, a de-multiplexer is also utilized in the scan ring expansion logic 24 to drive a single TMS signal in the system-under-test 11 from the TMS output of the test bus controller 16 (e.g., via TMS[n:0] signals of test bus controller I/F 36).

Thus, embodiments of the present invention reduce costs and labor associated with scan testing at least because such embodiments substantially eliminate the writing and maintaining of firmware on a scan controller, thereby also reducing the amount of board space required for such scan controller. Further, embodiments of the present invention enhance scan testing performance by eliminating interrupt mechanisms and other latency problems generally associated with microprocessor-based designs.

What is claimed is:

1. A scan system, comprising:
a non-microprocessor based scan engine adapted to receive a scan request from one of a plurality of host systems for performing a scan test on a system-under-test, the non-microprocessor based scan engine comprising dedicated logic where a state of the dedicated logic is adapted to control processing of the scan request on the system-under-test, wherein at least one of the host systems is not co-located with the system-under-test and the dedicated logic alternatively grants access to data to only one of the host systems at a time and blocks the other host systems from accessing the data.

2. The system of claim 1, wherein the state of the dedicated logic is adapted to write data to a register for the scan request.

3. The system of claim 1, wherein the state of the dedicated logic is adapted to read data from a register of memory for the scan request.

4. The system of claim 1, wherein the scan engine further comprises scan ring expansion logic adapted to process the scan request for a particular scan chain in the system-under-test.

5. The system of claim 1, wherein the dedicated logic comprises a host controller adapted to arbitrate a data access request received from a local host system and a remote host system.

6. The system of claim 1, wherein the scan engine comprises register logic having a status register for storing error and status bits associated with the scan test.

7. The system of claim 1, wherein the scan engine further comprises a test bus controller adapted to interface the dedicated logic with the system-under-test.

8. A scan test system, comprising:
a non-microprocessor based scan engine comprising of means for receiving a scan request from at least one host system of a plurality of host systems associated with performing a scan test on a system-under-test, and dedicated logic means adapted to process the scan request based on a state of the dedicated logic means, wherein at least one of the host systems is not co-located with the system-under-test and the dedicated logic means alternatively grants access to data to only one of the host systems at a time and blocks the other host systems from accessing the data.

9. The system of claim 8, further comprising means for arbitrating a data access request received from at least two different host systems.

10. The system of claim 8, further comprising a logic means for processing the scan request for a scan chain.

11. The system of claim 8, further comprising a logic means for storing error and status bits associated with the scan test.

12. The system of claim 8, wherein the dedicated logic means comprises means for interfacing the dedicated logic means with the system-under-test.

13. A scan test method, comprising:
receiving a scan request from at least one host system of a plurality of host systems for performing a scan test on a system-under-test; and
processing the scan request via dedicated logic of a non-microprocessor based scan engine, a state of the dedicated logic used to process the scan request on the system-under-test, wherein at least one of the host systems is not co-located with the system-under-test and the dedicated logic alternatively grants access to data to only one of the host systems at a time and blocks the other host systems from accessing the data.

14. The method of claim 13, further comprising arbitrating a data access request received from at least two different host systems.

15. The method of claim 13, further comprising preventing access to data by at least one host system via the dedicated logic while providing data access to another host system.

16. The method of claim 13, further comprising processing the scan request for a scan chain.

17. The method of claim 13, further comprising storing error and status bits associated with the scan test in a status register of register logic.

18. The method of claim 13, wherein processing the scan request comprises interfacing the dedicated logic with the system-under-test.

19. The method of claim 13, further comprising changing a state of the dedicated logic to write data to a register for the scan request.

20. The method of claim 13, further comprising changing a state of the dedicated logic to read data from a register for the scan request.

* * * * *